(12) United States Patent
Song

(10) Patent No.: US 7,402,871 B2
(45) Date of Patent: Jul. 22, 2008

(54) SEMICONDUCTOR DEVICE HAVING RESISTOR AND METHOD OF FABRICATING THE SAME

(75) Inventor: Du-Heon Song, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 423 days.

(21) Appl. No.: 11/284,237

(22) Filed: Nov. 21, 2005

(65) Prior Publication Data

US 2006/0118885 A1  Jun. 8, 2006

(30) Foreign Application Priority Data

Dec. 6, 2004  (KR) .................... 10-2004-0102002

(51) Int. Cl.
*H01L 29/76* (2006.01)
*H01L 21/20* (2006.01)

(52) U.S. Cl. .................... 257/379; 257/358; 438/238; 438/382

(58) Field of Classification Search ............ 257/358, 257/359, 360, 379, 300, 306; 438/238, 239, 438/382, 384
See application file for complete search history.

(56) References Cited

U.S. PATENT DOCUMENTS

| 4,620,212 | A | 10/1986 | Ogasawara | 357/51 |
| 6,004,838 | A * | 12/1999 | Ma et al. | 438/200 |
| 6,172,389 | B1 | 1/2001 | Sakoh | 257/296 |
| 6,255,161 | B1 * | 7/2001 | Lin | 438/254 |
| 6,548,851 | B2 | 4/2003 | Bae et al. | 257/306 |
| 6,587,320 | B1 * | 7/2003 | Russ et al. | 257/361 |
| 6,794,247 | B2 * | 9/2004 | Kwak et al. | 438/257 |
| 6,992,327 | B2 * | 1/2006 | Tone et al. | 257/379 |
| 7,183,612 | B2 * | 2/2007 | Okushima | 257/350 |
| 7,274,047 | B2 * | 9/2007 | Russ et al. | 257/133 |

FOREIGN PATENT DOCUMENTS

| JP | 2001-320016 | 11/2001 |
| KR | 1020010076467 | 8/2001 |
| KR | 1020030068614 | 8/2003 |

* cited by examiner

*Primary Examiner*—Kevin M Picardat
(74) *Attorney, Agent, or Firm*—Mills & Onello LLP

(57) ABSTRACT

In a semiconductor device having a resistor and a method of fabricating the same, the device includes a semiconductor substrate having a cell region and a peripheral region. A lower interlayer insulating layer is disposed on the semiconductor substrate. A buffer pad is disposed on the lower interlayer insulating layer in the cell region. A capacitor is provided to have a storage node electrode disposed on the buffer pad, a plate electrode covering the storage node electrode, and a capacitor dielectric is interposed between the storage node electrode and the plate electrode. A lower resistor is disposed on the lower interlayer insulating layer in the peripheral region. An upper resistor is disposed on the lower resistor to expose both ends of the lower resistor. An inter-resistor insulating layer is interposed at least between the lower resistor and the upper resistor. An upper interlayer insulating layer is disposed on the lower interlayer insulating layer to cover the capacitor, the lower resistor, and the upper resistor. A resistor interconnection line is disposed on the upper interlayer insulating layer, to contact a resistor contact plug penetrating the upper interlayer insulating layer and is electrically connected to a first end of the lower resistor and a first end of the upper resistor.

32 Claims, 10 Drawing Sheets

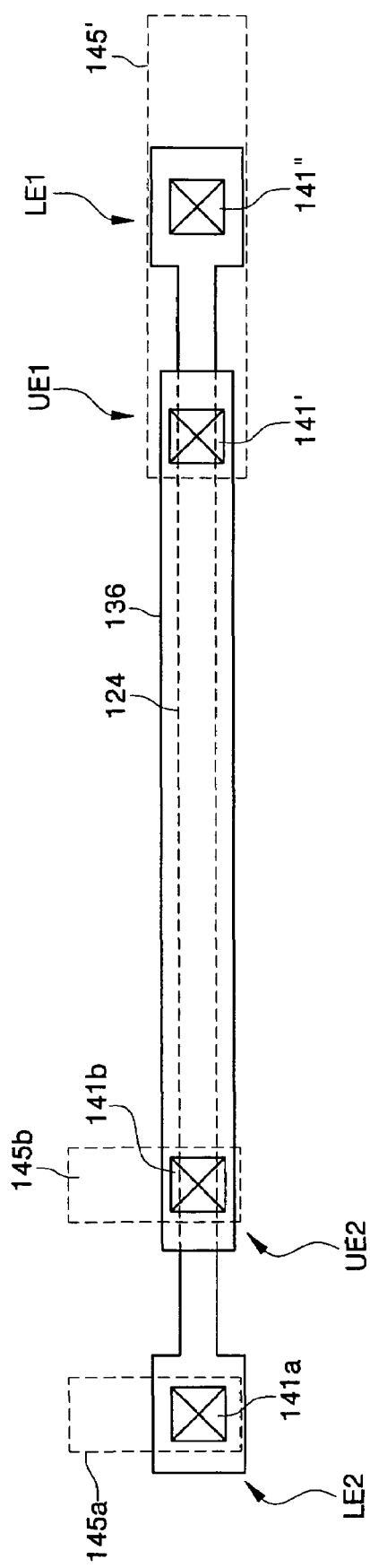

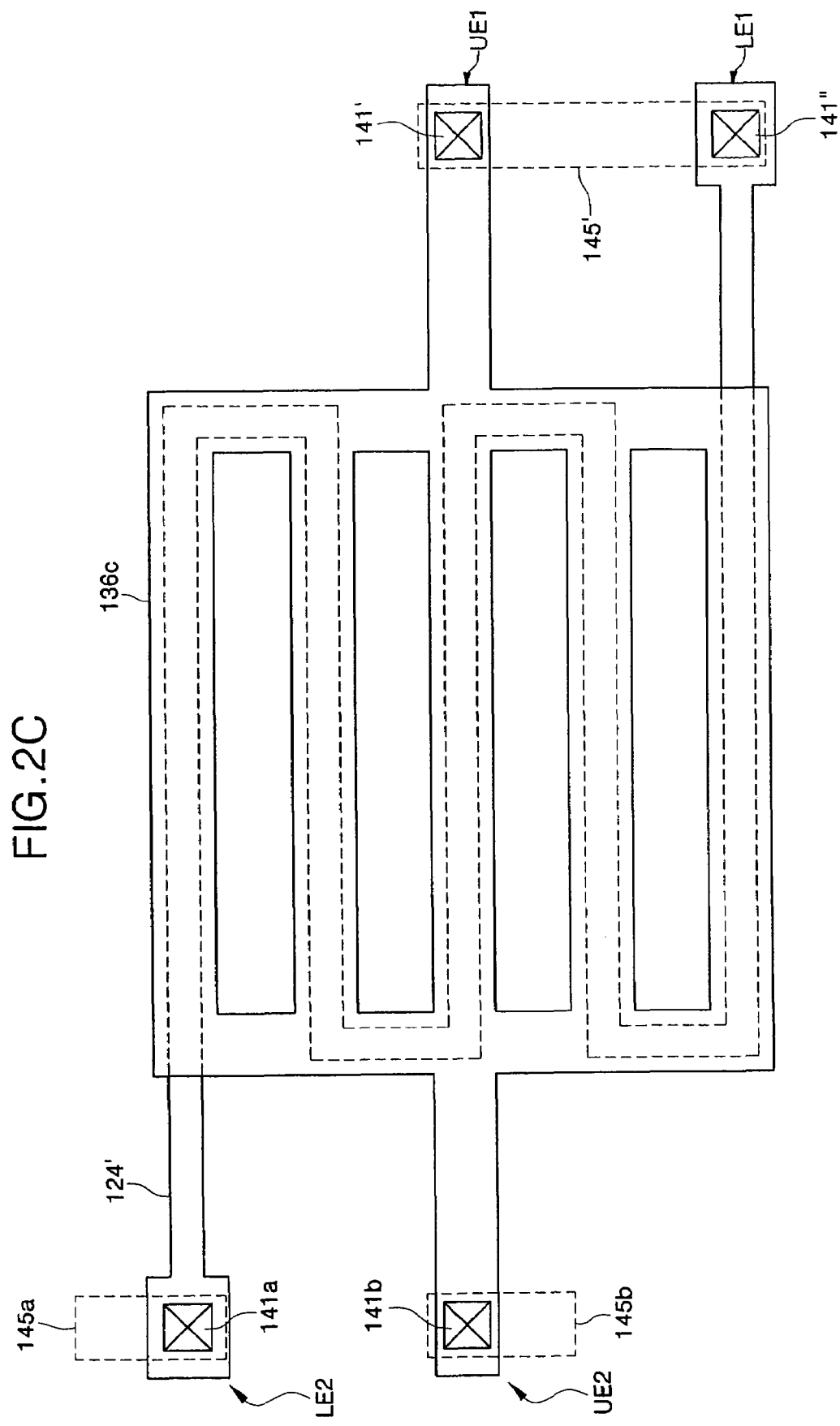

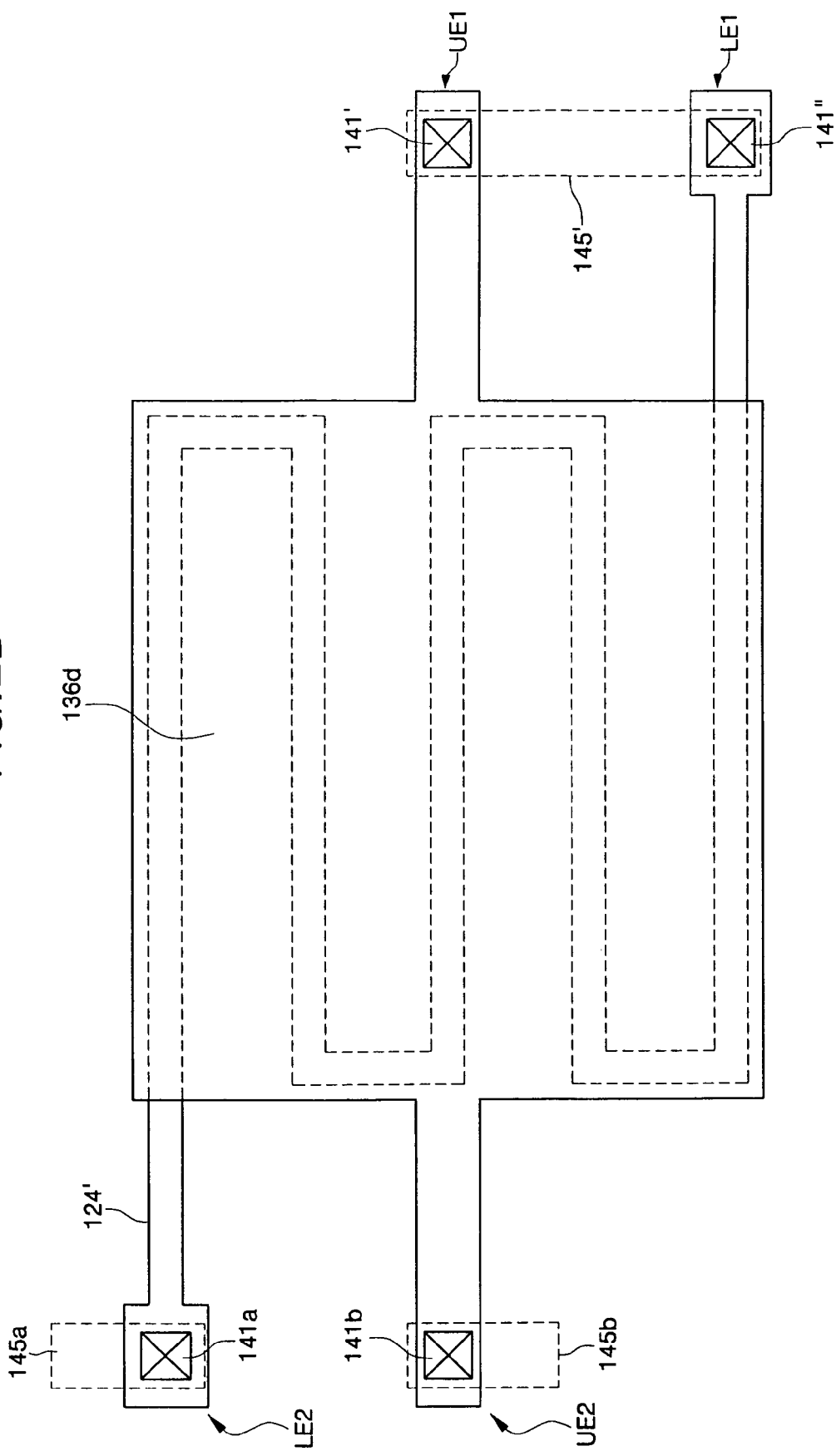

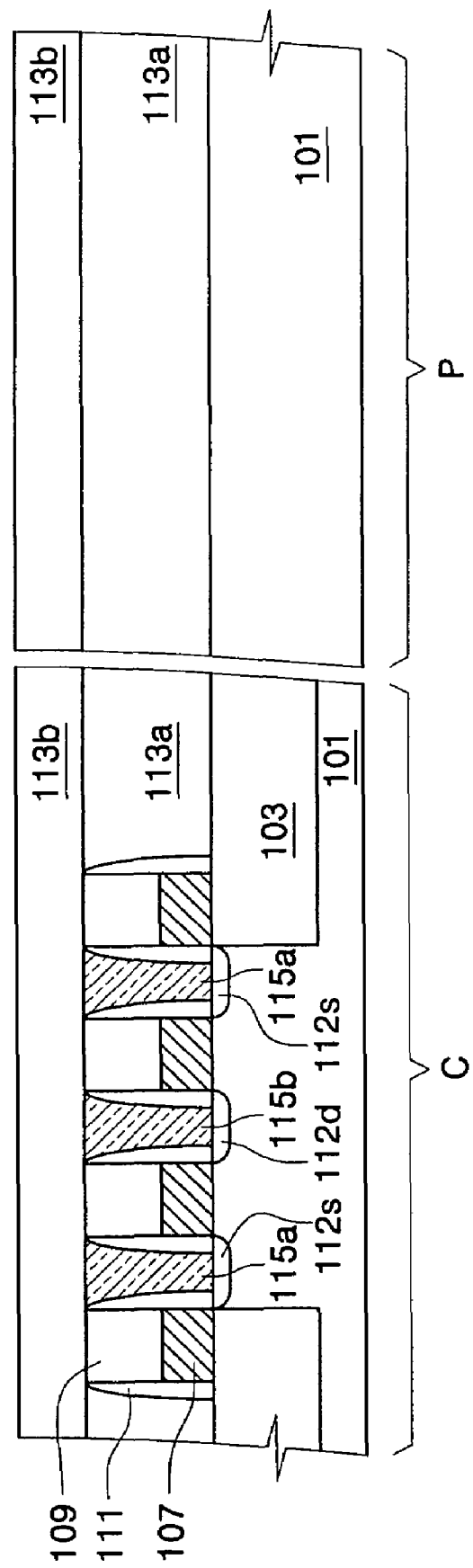

SEMICONDUCTOR DEVICE HAVING RESISTOR AND METHOD OF FABRICATING THE SAME

CROSS-REFERENCE TO RELATED APPLICATION

This application claims priority from Korean Patent Application No. 2004-0102002, filed on Dec. 6, 2004, the disclosure of which is hereby incorporated herein by reference in its entirety as if set forth fully herein.

BACKGROUND OF INVENTION

1. Technical Field

The present invention relates to a semiconductor device and a method of fabricating the same, and more particularly, to a semiconductor device having a resistor and a method of fabricating the same.

2. Discussion of the Related Art

A dynamic random access memory (DRAM) device is composed of a cell array region including a plurality of unit cells, and a peripheral region disposed around the cell array region to drive and control the unit cells. The peripheral region includes many elements such as transistors for driving the unit cells, diodes, resistors, and the like. Methods for forming resistors using a polysilicon layer are widely known.

A method of forming a resistor of a polysilicon layer has been disclosed in U.S. Pat. No. 4,620,212 entitled "Semiconductor device with a resistor of polycrystalline silicon" to Kazuo Ogasawara. Further, a method of fabricating a resistor of a DRAM device has been described in U.S. Pat. No. 6,172,389 entitled "Semiconductor memory device having a reduced area for a resistor element" to Takashi Sakoh.

In the conventional case where a polysilicon layer is used for a gate electrode, the polysilicon layer used as the gate electrode has also been used in the formation of a discrete resistor. However, in recent applications, a polycide layer including a polysilicon layer and a metal silicide layer has been employed as a gate electrode in order to reduce the resistance of the gate electrode. Such a polycide layer used as the gate electrode is no longer appropriate for used as a resistor. Further, a thick insulating layer may be interposed between a resistor formed at the same time as the process of forming the gate electrode, and of forming a metal interconnection disposed on a semiconductor device. A contact plug should be formed through the thick insulating layer in order to electrically connect the metal interconnection and the resistor. In this case, since a process of etching the thick insulating layer is necessarily performed during the process of forming the contact plug, it complicates formation of a small-sized contact plug, which is inappropriate in the recent trend of high integration of semiconductor devices.

SUMMARY OF THE INVENTION

The present invention is therefore directed to a semiconductor device including a resistor having a high and stable resistance value, and a method of formation thereof Another object of the present invention is to provide a method of fabricating a semiconductor device including a resistor for reducing a resistance distribution and increasing resistance variance.

In one aspect, the present invention is directed to a semiconductor device including a resistor having a high and stable resistance value. The semiconductor device includes a semiconductor substrate having a cell region and a peripheral region. A lower interlayer insulating layer is disposed on the semiconductor substrate. A buffer pad is disposed on the lower interlayer insulating layer in the cell region. A capacitor is provided to have a storage node electrode disposed on the buffer pad, a plate electrode covering the storage node electrode, and a capacitor dielectric is interposed between the storage node electrode and the plate electrode. A lower resistor is disposed on the lower interlayer insulating layer in the peripheral region. An upper resistor is disposed on the lower resistor to expose both ends of the lower resistor. An inter-resistor insulating layer is interposed at least between the lower resistor and the upper resistor. An upper interlayer insulating layer is disposed on the lower interlayer insulating layer to cover the capacitor, the lower resistor, and the upper resistor. A resistor interconnection line is disposed on the upper interlayer insulating layer, to contact a resistor contact plug penetrating the upper interlayer insulating layer and is electrically connected to a first end of the lower resistor and a first end of the upper resistor.

In one embodiment, the lower resistor and the buffer pad may be formed in a same process. The lower resistor and the buffer pad may be polysilicon layers.

In another embodiment, the upper resistor and the plate electrode may be formed in a same process. The upper resistor and the plate electrode may be a polysilicon layer, a stack layer including a titanium nitride layer and a polysilicon layer, a titanium layer, a tantalum layer, a tungsten layer, and a metal nitride layer. The metal nitride layer may be at least one layer selected from the group consisting of a TiN layer, a TaN layer, a WN layer, a TaSiN layer, a TiSiN layer, a TaAlN layer, and a TiAlN layer.

In another embodiment, the inter-resistor insulating layer and the capacitor dielectric may be formed in a same process. The capacitor dielectric and the inter-resistor insulating layer may be a stacked layer including a silicon oxide layer and a silicon nitride layer, or a high-k dielectric. The high-k dielectric may be at least one layer selected from the group consisting of a hafnium oxide (HfO) layer, an aluminum oxide (AlO) layer, a zirconium oxide (ZrO) layer, a lanthanum oxide (LaO) layer, a tantalum oxide (TaO) layer, a titanium oxide (TiO) layer, a doped TiO layer, and an STO layer.

In another embodiment, the semiconductor device may further include a first etch stop layer pattern interposed between the capacitor dielectric of the cell region and the lower interlayer insulating layer; and a second etch stop layer pattern interposed between the lower resistor of the peripheral region and the inter-resistor insulating layer. In this case, the first etch stop layer pattern and the second etch stop layer pattern may be formed in a same process. The first etch stop layer pattern and the second etch stop layer pattern may be silicon nitride layers.

In another embodiment, the semiconductor device may further include a first metal interconnection disposed on the upper interlayer insulating layer so as to contact a first contact plug penetrating the upper interlayer insulating layer and being electrically connected to a second end of the lower resistor; and a second metal interconnection disposed on the upper interlayer insulating layer so as to contact a second contact plug penetrating the upper interlayer insulating layer and being electrically connected to a second end of the upper resistor.

In another embodiment, the resistor contact plug may include a lower resistor contact plug and an upper resistor contact plug penetrating the upper interlayer insulating layer and being electrically connected to the first end of the lower resistor and the first end of the upper resistor respectively.

In another embodiment, the lower resistor may have a zig-zag line shape from a planar view orientation.

In another embodiment, the upper resistor may have a plate shape from a planar view orientation.

In another embodiment, the upper resistor may have a zig-zag line shape having a greater width than that of the lower resistor from a planar view orientation.

In another embodiment, the upper resistor includes multiple parallel resistor structures from a planar view orientation.

In another aspect, the present invention is directed to a method of fabricating a semiconductor device for reducing a resistance distribution and increasing resistance variance. The method includes forming a lower interlayer insulating layer on a semiconductor substrate having a cell region and a peripheral region. A buffer conductive layer is formed on the lower interlayer insulating layer. The buffer conductive layer is patterned, thereby forming a buffer pad on the lower interlayer insulating layer in the cell region, and concurrently, forming a lower resistor on the lower interlayer insulating layer in the peripheral region. A storage node electrode is formed on the buffer pad. A dielectric and a conductive layer are sequentially formed on the surface of the semiconductor substrate having the storage node electrode. The conductive layer and the dielectric are patterned, thereby forming a capacitor dielectric and a plate electrode in the cell region, and concurrently, forming an inter-resistor insulating layer and an upper resistor, which are sequentially stacked, to expose both ends of the lower resistor in the peripheral region. An upper interlayer insulating layer is formed on the surface of the semiconductor substrate having the plate electrode and the upper resistor. A resistor contact plug is formed in the upper interlayer insulating layer so as to be electrically connected to a first end of the lower resistor and a first end of the upper resistor. A resistor interconnection line is formed on the upper interlayer insulating layer to contact the resistor contact plug.

In one embodiment, the method may further include forming an etch stop layer on the surface of the semiconductor substrate having the buffer pad and the lower resistor before forming the storage node electrode, and patterning the conductive layer and the dielectric may further include patterning the etch stop layer. In this case, the etch stop layer may be formed of a silicon nitride layer.

In another embodiment, forming a resistor contact plug may include forming a lower resistor contact plug and an upper resistor contact plug penetrating the upper interlayer insulating layer and being electrically connected to the first end of the lower resistor and the first end of the upper resistor respectively.

In another embodiment, the method may further include forming a first contact plug and a second contact plug penetrating the upper interlayer insulating layer and being electrically connected to a second end of the lower resistor and a second end of the upper resistor respectively, concurrently while forming the resistor contact plug. In this case, forming a resistor interconnection line may further include forming a first metal interconnection and a second metal interconnection disposed on the upper interlayer insulating layer and contacting the first contact plug and the second contact plug respectively.

In another embodiment, the lower resistor may be formed to have a zig-zag line shape from a planar view orientation.

In another embodiment, the upper resistor may be formed to have a plate shape from a planar view orientation.

In another embodiment, the upper resistor may be formed to have a zig-zag line shape having a greater width than that of the lower resistor from a planar view orientation.

In another embodiment, the upper resistor may be formed to include multiple parallel resistor structures from a planar view orientation.

In another embodiment, the buffer conductive layer may be formed of a polysilicon layer.

In another embodiment, the conductive layer may be formed of a polysilicon layer, a stacked layer including a titanium nitride layer and a polysilicon layer, a titanium layer, a tantalum layer, a tungsten layer, or a metal nitride layer. In this case, the metal nitride layer may be formed of at least one layer selected from the group consisting of a TiN layer, a TaN layer, a WN layer, a TaSiN layer, a TiSiN layer, a TaAlN layer, and a TiAlN layer.

In another embodiment, the dielectric may be formed of a stacked layer including a silicon oxide layer and a silicon nitride layer, or a high-k dielectric. In this case, the high-k dielectric may be formed of at least one layer selected from the group consisting of a hafnium oxide (HfO) layer, an aluminum oxide (AlO) layer, a zirconium oxide (ZrO) layer, a lanthanum oxide (LaO) layer, a tantalum oxide (TaO) layer, a titanium oxide (TiO) layer, a doped TiO layer, and an STO layer.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIGS. 2A to 2D are plan views illustrating a resistor according to an embodiment of the present invention; and FIGS. 3A to 3E are sectional views illustrating a method of fabricating a semiconductor device according to an embodiment of the present invention.

DETAILED DESCRIPTION OF THE INVENTION

Figure 1:
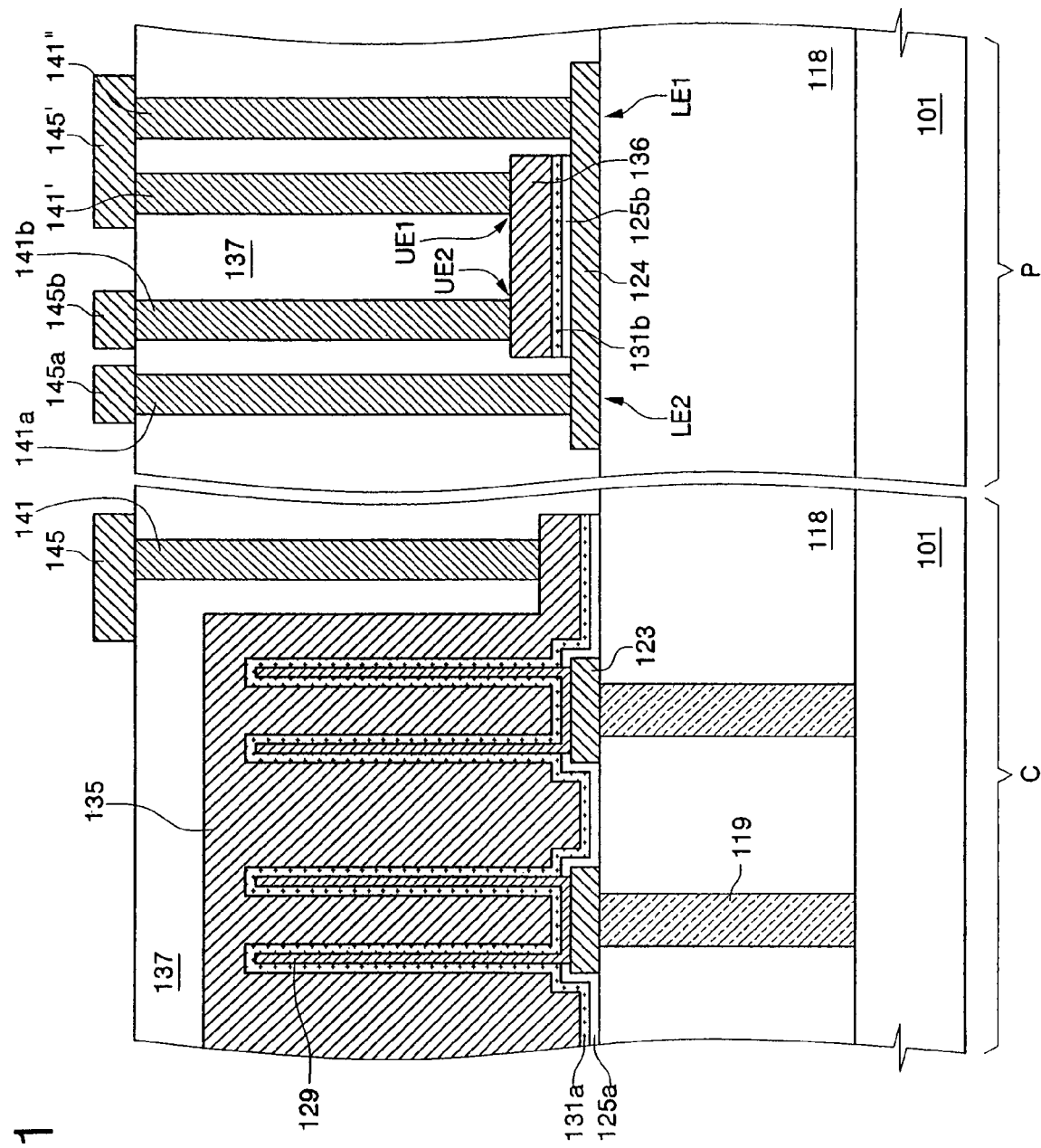
FIG. 1 is a sectional view illustrating a semiconductor device having a resistor according to an embodiment of the present invention.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete. In the drawings, the thicknesses of layers and regions are exaggerated for clarity. Like numbers refer to like elements throughout the specification.

FIG. 1 is a sectional view illustrating a semiconductor device having a resistor according to an embodiment of the present invention, and FIG. 2A is a plan view illustrating the resistor of FIG. 1. In FIG. 1, a region indicated by a reference letter "C" represents a cell region, and a region indicated by a reference letter "P" represents a peripheral region.

Referring to FIG. 1, a lower interlayer insulating layer 118 is disposed on a semiconductor substrate 101 having the cell region C and the peripheral region P. The lower interlayer insulating layer 118 may be a silicon oxide layer. Storage node contact plugs 119 are disposed through the lower interlayer insulating layer 118 of the cell region C so as to be electrically connected to a main surface of the semiconductor substrate 101. Though not shown in the drawing, an access transistor may be disposed on the semiconductor substrate 101 inside the lower interlayer insulating layer 118. In this case, the storage node contact plugs 119 may be electrically connected to a source region of a MOS transistor.

From the planar view of the storage node contact plugs 119, transverse and ordinate directions may be substantially straight lines. The storage node contact plugs 119 may be polysilicon layers.

Buffer pads 123 are disposed on the lower interlayer insulating layer 118 of the cell region C to cover the upper surfaces of the storage node contact plugs 119 respectively. The buffer pads 123 are electrically connected to the storage node contact plugs 119 respectively. The buffer pads 123 function to prevent contact failures of the storage node contact plugs 119 and storage node electrodes to be explained below. With the presence of the buffer pads 123, it is possible to more effectively provide suitable shape and alignment of the storage node electrodes. Each of the buffer pads 123 may have a rectangular shape or oval shape having a major axis and a minor axis. For example, the major axis of the buffer pads 123 may have an orientation normal to the major axis of the word lines. The buffer pads 123 aligned along an extension line of the minor axis of the buffer pads 123 may be aligned in zig-zag configuration. The buffer pads 123 are preferably formed of polysilicon layers.

Storage node electrodes 129 are disposed on the buffer pads 123. The storage node electrodes 129 may be formed of polysilicon layers or metal layers, and may have a cylindrical shape as shown in FIG. 1. In more specific, the storage node electrodes 129 may be aligned in zig-zag configuration, and may have a circular shape, oval shape, or polygonal shape in the planar view. When the storage node electrodes 129 are aligned in a zig-zag configuration, the distance between the storage node electrodes 129 in the cell region C can be sufficiently ensured. As a result, the height of the storage node electrode 129 can be increased without increased failures such as falling-down or rupture of the storage node electrodes 129.

The storage node electrodes 129 are conformally covered by a capacitor dielectric 131a. Further, a plate electrode 135 is disposed on the capacitor dielectric 131a. In this case, the plate electrode 135, the storage node electrodes 129, and the capacitor dielectric 131a interposed between them constitute a capacitor. The capacitor dielectric 131a may comprise a stacked layer including a silicon oxide layer and a silicon nitride layer, or a high-k dielectric layer. More specific, the stacked layer including a silicon oxide layer and a silicon nitride layer may comprise a double layer composed of a silicon oxide layer and a silicon nitride layer, or a triple layer composed of a silicon oxide layer, a silicon nitride layer, and a silicon oxide layer, which are sequentially stacked. The high-k dielectric layer may be at least one layer selected from the group consisting of a hafnium oxide (HfO) layer, an aluminum oxide (AlO) layer, a zirconium oxide (ZrO) layer, a lanthanum oxide (LaO) layer, a tantalum oxide (TaO) layer, a titanium oxide (TiO) layer, a doped TiO layer, and an STO layer.

The plate electrode 135 may be formed of a single layer composed of a polysilicon layer, or a stack layer composed of a titanium nitride (TiN) layer and a polysilicon layer. Alternatively, the plate electrode 135 may be a metal layer. More specifically, the plate electrode 135 may be a metal layer including a Ti layer, a Ta layer, or a W layer, or a double-element nitride layer composed of a nitride compound of the metal. Further, the plate electrode 135 may be a triple-element nitride layer consisting of a double-element nitride layer and Al or Si atoms. For example, the plate electrode 135 may be at least one layer selected from the group consisting of a Ti layer, a Ta layer, a W layer, a TiN layer, a TaN layer, a WN layer, a TaSiN layer, a TiSiN layer, a TaAlN layer, and a TiAlN layer.

In the meantime, a first etch stop layer pattern 125a may be interposed between the capacitor dielectric 131a and the lower interlayer insulating layer 118. More specifically, the first etch stop layer pattern 125a may be formed on the lower interlayer insulating layer 118 of the cell region C having the buffer pads 123 disposed thereon, to conformally cover the lower interlayer insulating layer 118 except for the upper surfaces of the buffer pads 123. The storage node electrodes 129 contact the exposed surfaces of the buffer pads 123 respectively by the first etch stop layer pattern 125a. The first etch stop layer pattern 125a may be a material layer having an etch selectivity with respect to the lower interlayer insulating layer 118. For example, in the case that the lower interlayer insulating layer 118 is a silicon oxide layer, the first etch stop layer pattern 125a may be a silicon nitride layer.

Figure 2B:
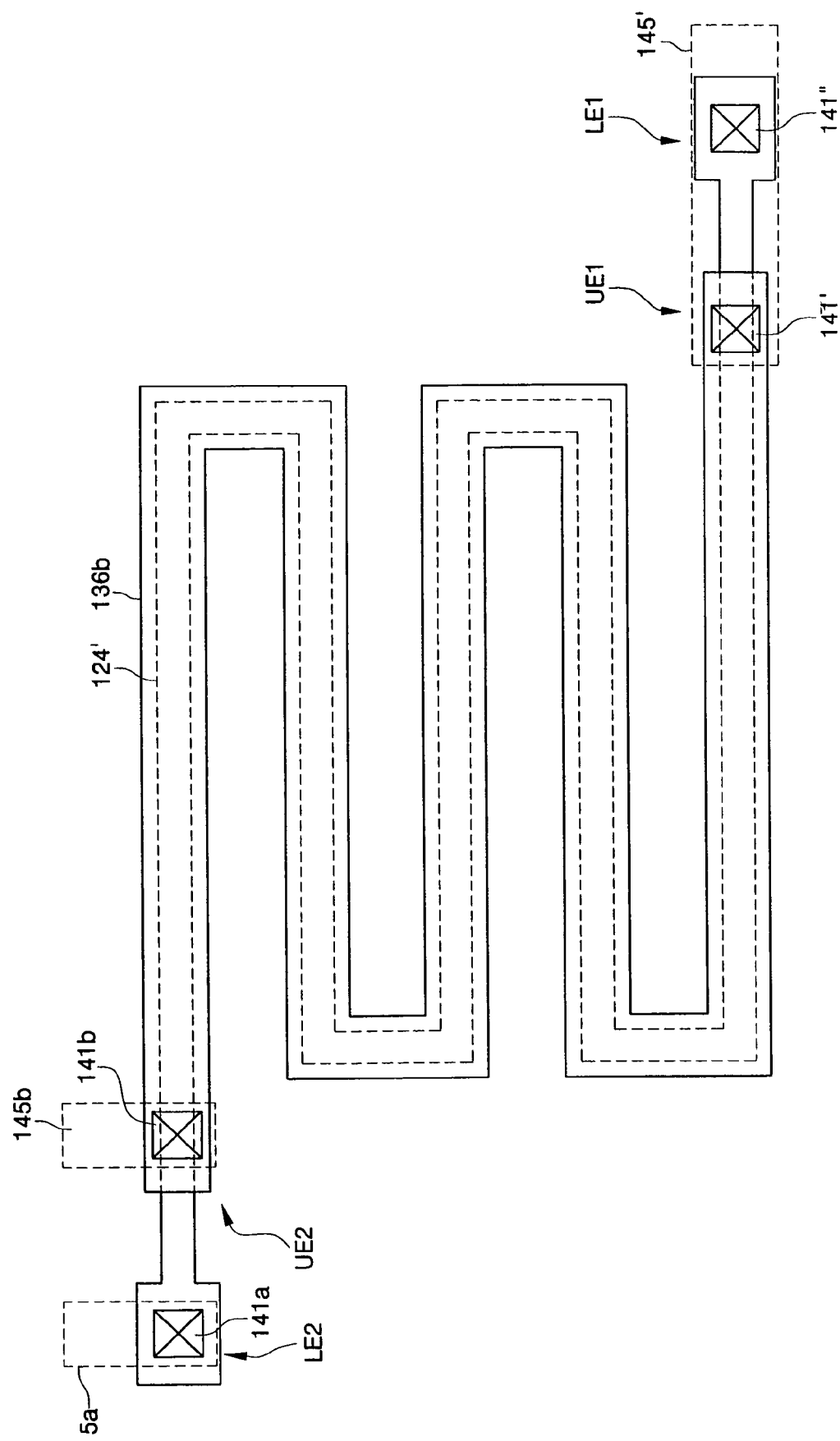

A lower resistor 124 is disposed on the lower interlayer insulating layer 118 of the peripheral region R. The lower resistor 124 may be formed of a material layer by the same process as that used for forming the buffer pads 123. Thus, in the case where the buffer pads 123 are formed of a polysilicon layer as described above, the lower resistor 124 may be also formed of a polysilicon layer. As shown in FIG. 2A, the lower resistor 124 may have a linear shape from the planar view. Alternatively, the lower resistor 124 may be aligned with a zig-zag line shape configuration as shown in FIG. 2B in order to achieve a higher resistance.

An upper resistor 136 is disposed on the lower resistor 124. The upper resistor 136 may be formed of a material layer by the same process as forming the plate electrode 135. The upper resistor 136 is disposed to expose both ends LE1, LE2 of the lower resistor 124. Further, the upper resistor 136 is disposed to cover a body portion between the both ends LE1, LE2 of the lower resistor 124.

As shown in FIG. 2A, in the case that the lower resistor 124 has a linear shape, the upper resistor 136 may have a linear shape exposing the both ends LE1, LE2 of the lower resistor 124 and having a greater width than that of the lower resistor 124. The both ends LE1, LE2 of the lower resistor 124 exposed by the upper resistor 136 may be connected to contact plugs having different purposes, which will be explained below. In the present invention, the entire area occupied by the lower resistor 124 on the lower interlayer insulating layer 118 may be substantially the same as the area occupied by the upper resistor 136 on the lower interlayer insulating layer 118. Further, the lower resistor 124 and the upper resistor 136 may be vertically disposed within substantially the same area.

An inter-resistor insulating layer 131b is interposed at least between the lower resistor 124 and the upper resistor 136. The inter-resistor insulating layer 131b may be formed of the same material layer as the capacitor dielectric 131a, by the same process as forming the capacitor dielectric 131a. In the process, the inter-resistor insulating layer 131b may be formed in the same pattern as the pattern of the upper resistor 136, for example in the same patterning process. As a result, the inter-resistor insulating layer 131b and the upper resistor 136 may be stacked with substantially the same shape in the planar view orientation. Further, a second etch stop layer pattern 125b may be interposed between the inter-resistor insulating layer 131b and the lower resistor 124. The second etch stop layer pattern 125b may be formed of the same material layer as the first etch stop layer pattern 125b, by the same process as forming the first etch stop layer pattern 125b. Thus, the second etch stop layer pattern 125b may be the same silicon nitride layer as the first etch stop layer pattern 125a. The second etch stop layer pattern 125b, the inter-resistor insulating layer 131b, and the upper resistor 136 may be stacked with substantially the same shape in the planar view orientation.

An upper interlayer insulating layer 137 is disposed on the lower interlayer insulating layer 118 to cover the capacitor, the lower resistor 124, and the upper resistor 136. The upper interlayer insulating layer 137 may be a silicon oxide layer.

A plate interconnection 145 is disposed on the upper interlayer insulating layer 137 of the cell region C. The plate interconnection 145 is connected to the plate electrode 135 by a plate contact plug 141 penetrating the upper interlayer insulating layer 137.

A resistor interconnection line 145' is disposed on the upper interlayer insulating layer 137. The resistor interconnection line 145' is disposed to contact an upper resistor contact plug 141' and a lower resistor contact plug 141" penetrating the upper interlayer insulating layer 137, and being respectively connected with one end UE1 of the upper resistor 136, and one end LE1 of the lower resistor 124 exposed by the upper resistor 136. As a result, the lower resistor 124 and the upper resistor 136 are connected in series by the resistor interconnection line 145'. In the meantime, the upper resistor contact plug 141' and the lower resistor contact plug 141" can be made to one contact plug. That is, a contact hole exposing both of the one end UE1 of the upper resistor 136, and the one end LE1 of the lower resistor 124 is formed inside the upper interlayer insulating layer 137, and a contact plug can be formed inside the contact hole. In this case, the upper resistor contact plug 141' and the lower resistor contact plug 141" can be connected with the resistor interconnection line 145' by the contact plug connected with the ends LE1, UE1 concurrently.

A first metal interconnection 145a and a second metal interconnection 145b are disposed on the upper interlayer insulating layer 137 of the peripheral region P, and the first metal interconnection 145a and the second metal interconnection 145b are electrically connected to the other end LE2 of the lower resistor and the other end UE2 of the upper resistor respectively. The first metal interconnection 145a is connected to the lower resistor 124 by the first contact plug 141a penetrating the upper interlayer insulating layer 137. Further, the second metal interconnection 145b is connected to the other end UE2 of the upper resistor by the second contact plug 141b penetrating the upper interlayer insulating layer 137.

In the present invention, the resistor of the semiconductor device includes the upper resistor 136, and the lower resistor 124 connected in series to the upper resistor 136 by the resistor interconnection line 145'. The lower resistor 124 may be formed of the same material layer as the buffer pads 123, for example, a polysilicon layer. The upper resistor 136 is formed of the same material layer as the plate electrode 135. Thus, desired resistance values can be normally determined by using the lower resistor 124 having a higher resistance than the plate electrode 135, and then, the overall resistance value can be precisely controlled by using the upper resistor 136 having a relatively low resistance, thereby providing an improved resistance variability characteristic. Further, as described above, since the upper resistor 136 and the lower resistor 124 can be vertically stacked in substantially the same area of the device, the structural characteristics can well meet the high integration demand imposed on semiconductor devices.

In the meantime, the lower resistor 124 and the upper resistor 136 can be formed in a diverse number of shapes. Hereinafter, a resistor according other embodiments of the present invention will be explained in reference to FIGS. 2B to 2D. In these embodiments, a lower resistor to be described below has a zig-zag line shape configuration in order to realize a high resistance. Upper resistor elements to be explained hereinafter are connected to the lower resistor in series like the above embodiment of the present invention as described above.

As shown in FIG. 2B, an upper resistor 136b is formed with a zig-zag shape to cover a body portion of a lower resistor 124', and the upper resistor has a larger width than that of the lower resistor 124' except for both contact ends LE1, LE2 of the lower resistor 124'.

As shown in FIG. 2C, an upper resistor 136c may be formed with a parallel structural shape to cover a body portion of a lower resistor 124' with a greater width than that of the lower resistor 124' except for both contact ends LE1, LE2 of the lower resistor 124'. As a result, the upper resistor 136c comprises a resistance element in a parallel structural shape. More specifically, the upper resistor 136c is formed as a ladder shape with both ends of the zig-zag lines connected to each other, thereby covering the lower resistor 124'.

As shown in FIG. 2D, the upper resistor 136d may cover a body portion of a lower resistor 124' as a plate shape except for both ends LE1, LE2 of the lower resistor 124'.

As a result, the lower resistor is disposed with a zig-zag shape from the planar view orientation, thereby achieving a high resistance value. The upper resistors may optionally be configured in various shapes, as shown. The resistance value of each of the upper resistors is relatively low as compared to that of the lower resistor, however resistance variation in the upper resistors is great. Thus, since a general resistance value is determined by the lower resistor, and a precise resistance value can be controlled by the upper resistor, the overall combined upper and lower resistor can have a desired high resistance value with small and stable resistance distribution, to a high degree of accuracy.

FIGS. 3A to 3E are sectional views illustrating a method of fabricating a semiconductor device according to an embodiment of the present invention. In FIGS. 3A to 3E, a reference letter "C" represents a cell region, and a reference letter "P" represents a peripheral region.

Referring to FIG. 3A, a semiconductor substrate 101 having a cell region C and a peripheral region P is prepared. An isolation layer 103 is formed in a predetermined region of the semiconductor substrate 101, thereby confining an active region. A plurality of word lines 107 are formed to run over the active region on the semiconductor substrate in the cell region C. More specifically, a gate insulating layer (not shown) is formed on the surface of the active region, and a gate conductive layer is formed on the entire surface of the semiconductor substrate having the gate insulating layer. Then, the gate conductive layer and the gate insulating layer are patterned, thereby forming a plurality of parallel word lines 107 that run across the active region. The gate insulating layer may be formed of a silicon oxide layer or a high-k dielectric layer. The high-k dielectric layer means a dielectric layer having a higher dielectric constant than that of the silicon oxide layer. The gate conductive layer may be formed of a silicon layer or a metal layer. Alternatively, the gate conductive layer may be formed of a stack layer including a silicon layer and a metal silicide layer. In the case of patterning the gate conductive layer, a capping insulating layer may be formed in order to protect the gate conductive layer. As a result, a capping insulating layer pattern 109 may be formed on the word lines 107. The capping insulating layer may be formed of a silicon nitride layer. Gate spacers 111 are formed to surround the sidewalls of the word lines 107. The gate spacers 111 may be formed of a silicon nitride layer.

Impurity ions are implanted into the active region, using the word lines 107 and the isolation layer 103 as ion implantation masks, thereby forming a common drain region 112$d$ and source regions 112$s$. As a result, a pair of access transistors sharing the common drain region 112$d$ are formed in the active region. A first interlayer insulating layer 113$a$ is formed on the overall surface of the semiconductor substrate 101. The first interlayer insulating layer 113$a$ may be formed of a silicon oxide layer.

Storage node contact pads 115$a$ and a bit line contact pad 115$b$ are formed inside the first interlayer insulating layer 113$a$ of the cell region to contact the source regions 112$s$ and the common drain region 112$d$ respectively. A second interlayer insulating layer 113$b$ is formed on the first interlayer insulating layer 113$a$. The second interlayer insulating layer 113$b$ may be formed of a silicon oxide layer.

Figure 3B:
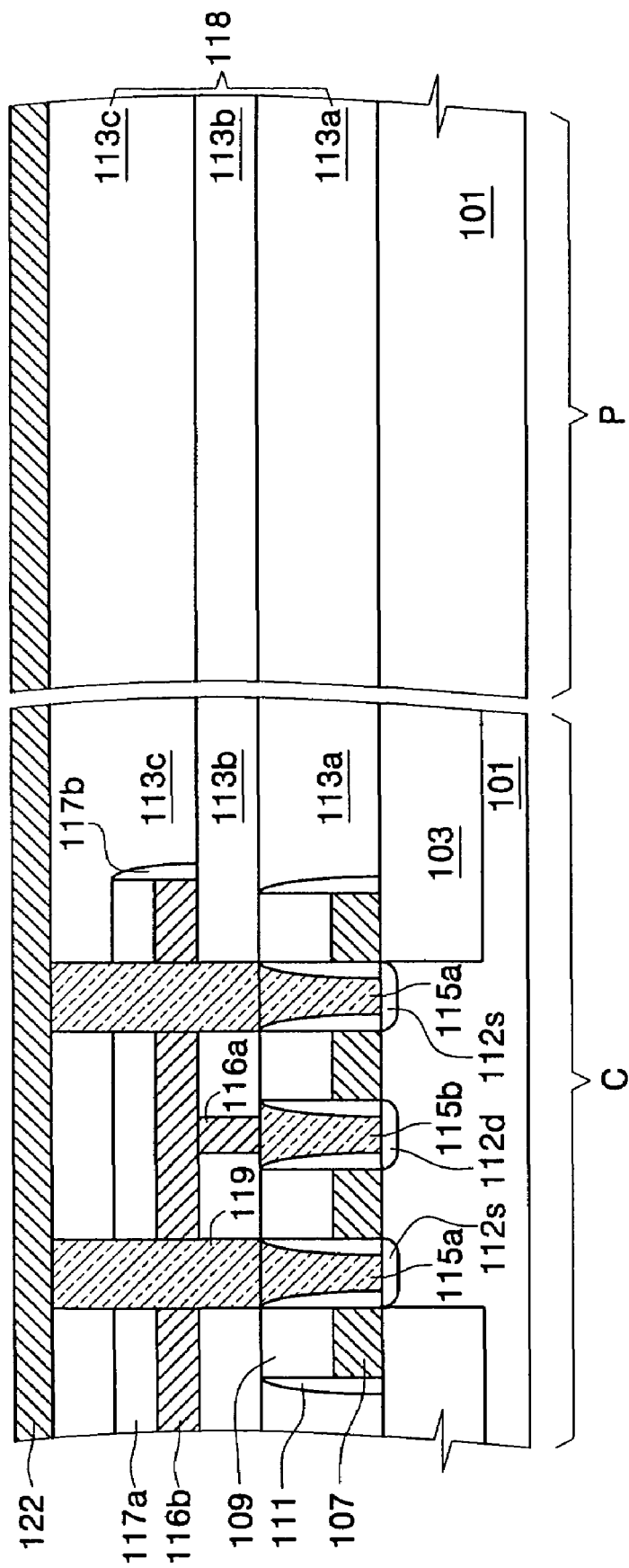

Referring to FIG. 3B, the second interlayer insulating layer 113$b$ is patterned, thereby forming a bit line contact hole 116$a$ exposing the bit line contact pad 115$b$. A conductive layer for bit line and a hard mask layer are formed on the overall surface of the semiconductor substrate having the bit line contact hole 116$a$. The hard mask layer and the conductive layer for bit line are patterned, thereby forming a hard mask layer pattern 117$a$ and a bit line 116$b$ running across the word lines 107. The bit line 116$b$ is electrically connected to the bit line contact pad 115$b$ through the bit line contact hole 116$a$. The hard mask layer pattern 117$a$ may be formed of a silicon nitride layer.

The bit line 116$b$ may be formed of a silicon layer or a meal layer. Alternatively, the bit line 116$b$ may be formed of a stack layer including a titanium nitride (TiN) layer and a tungsten (W) layer. A bit line spacer 117$b$ is formed to cover the sidewall of the bit line 116$b$. The bit line spacer 117$b$ may be a silicon nitride layer. A third interlayer insulating layer 113$c$ is formed on the overall surface of the semiconductor substrate having the bit line 116$b$. The third interlayer insulating layer 113$c$ may be a silicon oxide layer. The first interlayer insulating layer 113$a$, the second interlayer insulating layer 113$b$, and the third interlayer insulating layer 113$c$ constitute a lower interlayer insulating layer 118.

The third interlayer insulating layer 113$c$ and the second interlayer insulating layer 113$b$ of the cell region C are patterned, thereby forming storage node contact holes exposing the storage node contact pads 115$a$. Then, storage node contact plugs 119 are formed inside the storage node contact holes using a typical process. A buffer conductive layer 122 is formed on the overall surface of the semiconductor substrate having the storage node contact plugs 119. The buffer conductive layer 122 is preferably formed of a polysilicon layer.

Figure 3C:
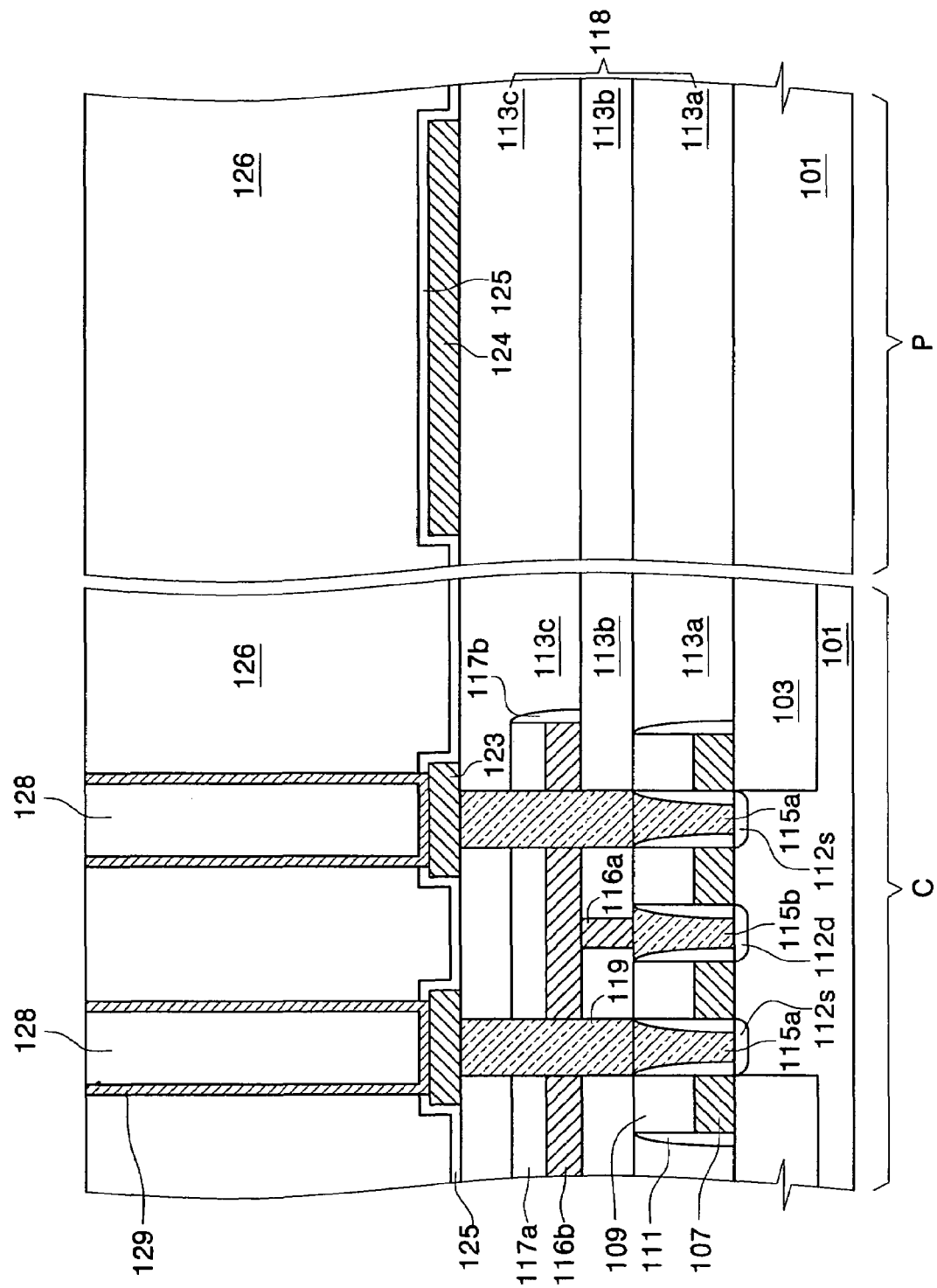

Referring to FIG. 3C, the buffer conductive layer 122 (FIG. 3B) is patterned, thereby forming buffer pads 123 on the lower interlayer insulating layer 118 of the cell region C, and concurrently, forming a lower resistor 124 on the lower interlayer insulating layer 118 of the peripheral region P. A process of forming the buffer pads 123 uses photolithography equipment being capable of realizing a fine line width. Thus, the lower resistor 124 can be formed to have a fine line width. Further, the lower resistor 124 can be configured in a zig-zag line shape having a fine line width from the planar view orientation, so as to provide a high resistance value. The buffer pads 123 are electrically connected to the storage node contact plugs 119 respectively.

Alternatively, the formation of the buffer conductive layer 122 (FIG. 3B) may be added to a process of forming the storage node contact plugs 119. That is, after the storage node contact holes are formed, a conductive layer for storage node contact plugs is formed to fill the storage node contact holes. In this case, the conductive layer for storage node contact plugs is formed on the third interlayer insulating layer 113$c$ with a predetermined thickness. Then, typical photolithography and etch processes are performed to pattern the conductive layer for storage node contact plugs, thereby integrally forming the storage node contact plugs 119 and the buffer pads 123.

The buffer pads 123 function to prevent a contact failure between storage node electrodes to be described below and the storage node contact plugs 119. Further, the presence of the buffer pads 123 facilitate effective shaping and alignment of the storage node electrodes. Each of the buffer pads 123 may have a rectangular shape or oval shape having a major axis and a minor axis. For example, the major axis of the buffer pads 123 may have an orientation normal to the major axis of word lines 107. The buffer pads 123 may be aligned in zig-zag shape along their minor axis.

An etch stop layer 125 is formed on the overall surface of the semiconductor substrate having the buffer pads 123 and the lower resistor 124. A mold insulating layer 126 is formed on the overall surface of the semiconductor substrate having the etch stop layer 125. The mold insulating layer 126 may be formed of a silicon oxide layer. The etch stop layer 125 preferably has an etch selectivity with respect to the mold insulating layer 126. For example, in the case that the mold insulating layer 126 is formed of a silicon oxide layer, the etch stop layer 125 may be formed of a silicon nitride layer.

Storage node electrode holes exposing the buffer pads 123 are formed in order to pattern the mold insulating layer 126 and the etch stop layer 125. A conformal conductive layer for the storage node electrode is formed on the overall surface of the semiconductor substrate having the storage node electrode holes. The conductive layer for the storage node electrode may be formed of a polysilicon layer or a metal layer.

Then, a buffer insulating layer is formed on the conductive layer for storage node electrode to fill the storage node electrode holes. The buffer insulating layer may be formed of a silicon oxide layer. Then, a planarization process is performed to expose an upper surface of the mold insulating layer 126. As a result, the storage node electrodes 129 and the buffer insulating layer patterns 128 are formed. The storage node electrodes 129 are electrically connected to the buffer pads 123 respectively. Each of the storage node electrodes 129 may be formed to have a cylindrical shape. More specifically, the storage node electrodes 129 may be aligned in zig-zag shape from the planar view orientation. Each of the storage node electrodes 129 may have a circular shape, oval shape, or polygonal shape in the planar view orientation. When the storage node electrodes 129 are aligned in a zig-zag orientation, the distance between the storage node electrodes 129 in the cell region C can be sufficiently ensured. As a result, the height of the storage node electrode 129 can be increased without risk of catastrophic failure such as falling-down or rupture of the storage node electrodes 129.

Figure 3D:
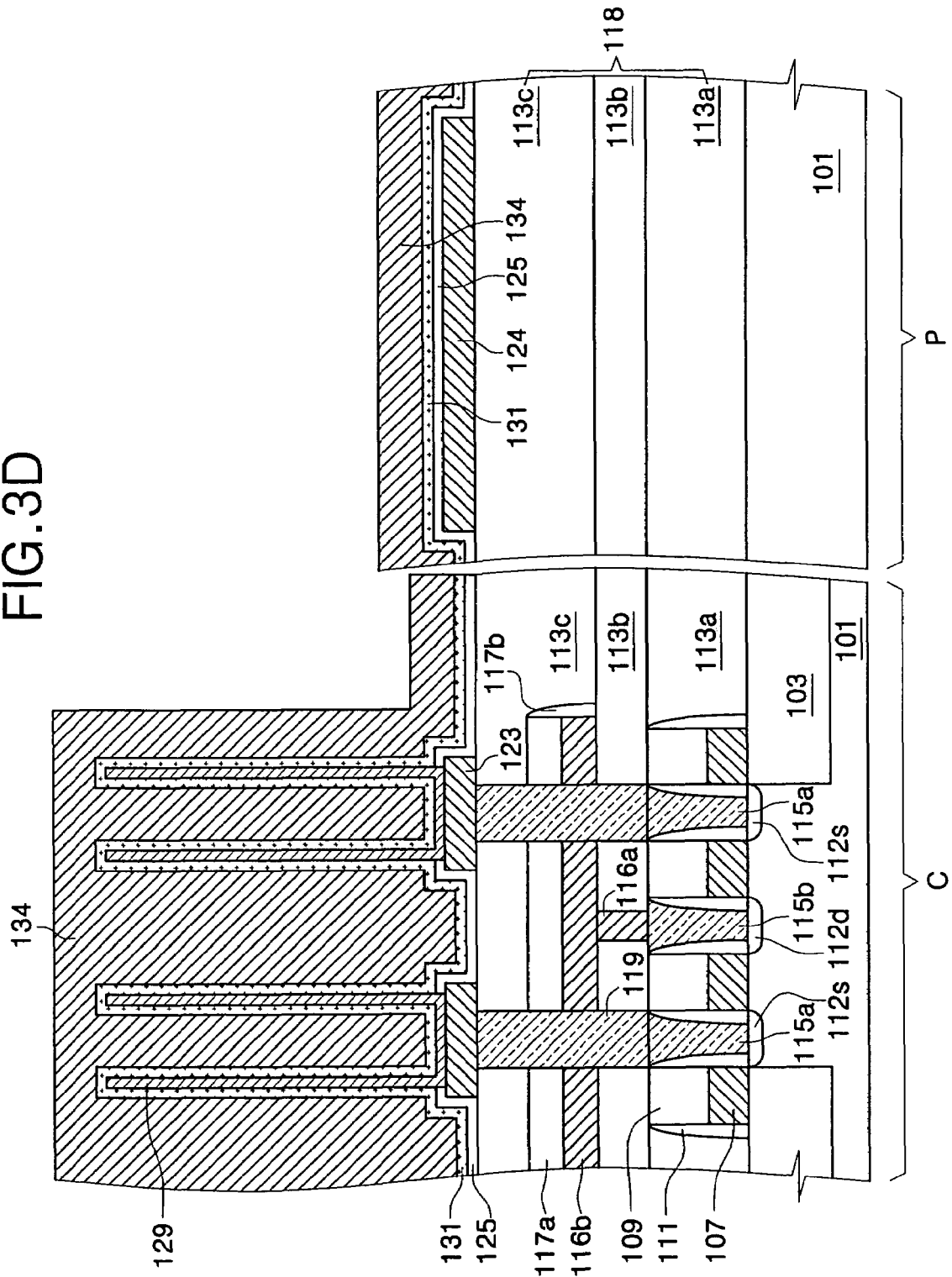

Referring to FIG. 3D, the mold insulating layer 126 (FIG. 3C) and the buffer insulating layer patterns 128 (FIG. 3C) are removed. Then, a conformal dielectric 131 is formed on the overall surface of the semiconductor substrate having the storage node electrodes 129. The dielectric 131 may be formed of a high-k dielectric layer.

For example, the dielectric 131 may comprise a stacked layer including a silicon oxide layer and a silicon nitride layer, or a high-k dielectric layer. More specifically, the stack layer including a silicon oxide layer and a silicon nitride layer may be a double layer composed of a silicon oxide layer and a silicon nitride layer, or a triple layer composed of a silicon oxide layer, a silicon nitride layer, and a silicon oxide layer, which are sequentially stacked. The high-k dielectric may comprise at least one layer selected from the group consisting of a hafnium oxide (HfO) layer, an aluminum oxide (AlO) layer, a zirconium oxide (ZrO) layer, a lanthanum oxide (LaO) layer, a tantalum oxide (TaO) layer, a titanium oxide (TiO) layer, a doped TiO layer, and an STO layer.

A conductive layer 134 is formed on the overall surface of the semiconductor substrate having the dielectric 131. The conductive layer 134 may be formed of a polysilicon layer, or a stack layer including a titanium nitride (TiN) layer and a polysilicon layer. Alternatively, the conductive layer 134 may be formed of a metal layer. More specifically, the conductive layer 134 may be formed of a metal layer including a titanium (Ti) layer, a tantalum (Ta) layer, or a tungsten (W) layer, or a double-element nitride layer composed of a nitride compound of the metal. Further, the conductive layer 134 may be a triple-element nitride layer consisting of the double-element nitride layer and Al or Si atoms. For example, the conductive layer 134 may be formed of at least one layer selected from the group consisting of a Ti layer, a Ta layer, a W layer, a TiN layer, a TaN layer, a WN layer, a TaSiN layer, a TiSiN layer, a TaAlN layer, and a TiAlN layer.

Figure 3E:
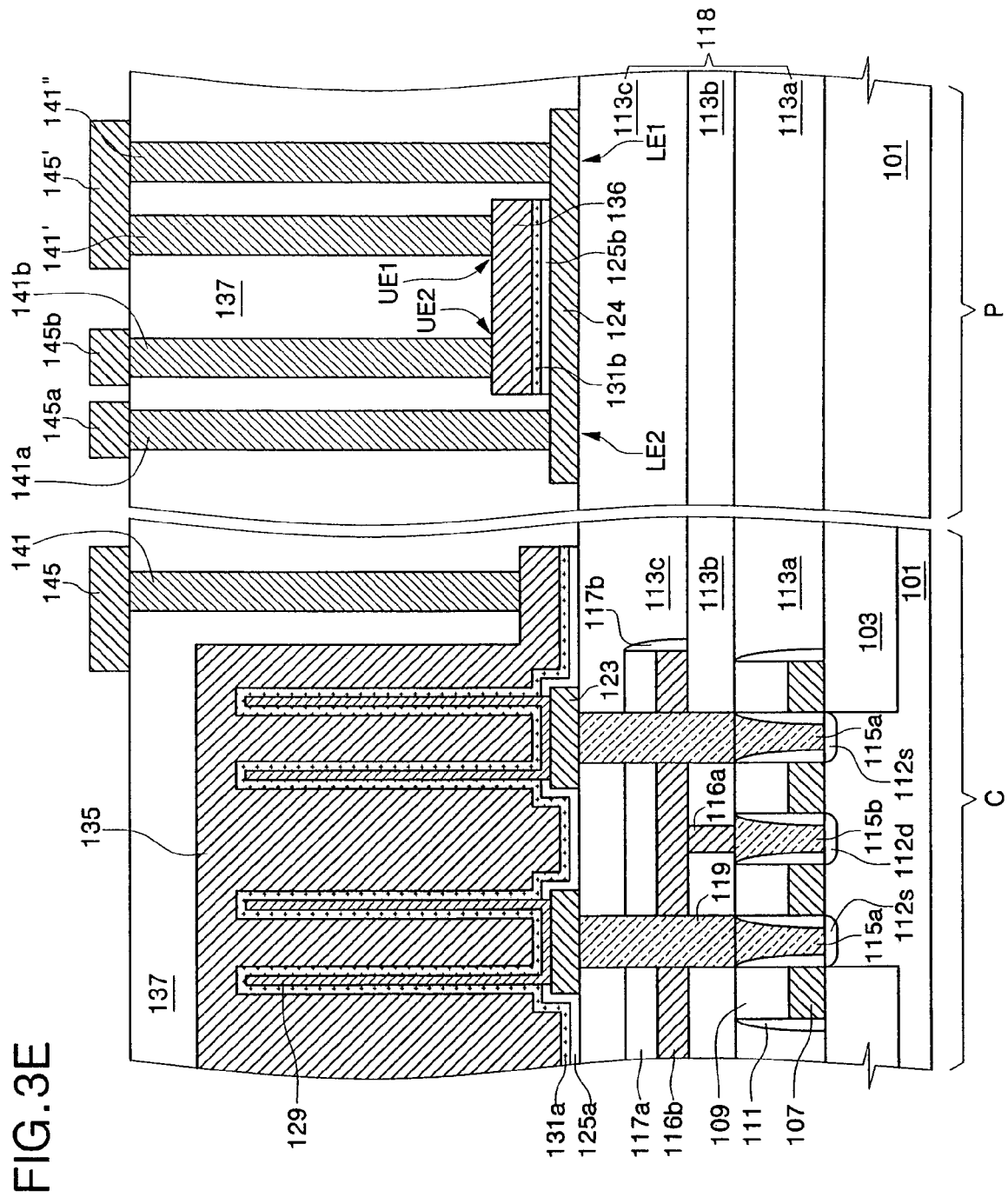

Referring to FIG. 3E, the conductive layer 134 (FIG. 3D) is patterned, thereby forming a plate electrode 135 in the cell region C, and concurrently, forming an upper resistor 136 in the peripheral region P. In this case, while the plate electrode 135 and the upper resistor 136 are formed, the exposed dielectric 131 (FIG. 3D) and the etch stop layer 125 (FIG. 3D) are also patterned. As a result, a first etch stop layer pattern 125a and a capacitor dielectric 131a are formed below the plate electrode 135, and a second etch stop layer pattern 125b and an inter-resistor insulating layer 131b are formed below the upper resistor 136.

The plate electrode 135, the capacitor dielectric 131a, and the storage node electrodes 129 constitute a capacitor. The upper resistor 136 of the peripheral region P is formed to cover a body portion of the lower resistor 124 except for the both ends LE1, LE2 of the lower resistor 124.

In the process of patterning the conductive layer 134 (FIG. 3D), the dielectric 131 (FIG. 3D), and the etch stop layer 125 (FIG. 3D), since the upper resistor 136 covers the body portion of the lower resistor 124, etch damage of the lower resistor 124, which would otherwise occur during the patterning process, can be prevented. That is, a change in thickness of the lower resistor 124 which otherwise would result from etch damage can be prevented. As a result, variation in resistance value of the resulting resistor, which otherwise may occur due to the thickness change of the lower resistor 124, can be reduced.

The process of patterning the conductive layer 134 (FIG. 3D) is performed using a photolithography apparatus capable of providing a larger line width than in the process of forming the buffer pads 123. Thus, the upper resistor 134 has a larger line width than that of the lower resistor 124. Since the plate electrode 135 of the cell region C is used in common to a plurality of capacitors of the cell region C, a photolithography process used for a process of forming the plate electrode 135 is performed to define a cell edge. Thus, the process of patterning the conductive layer 134 (FIG. 3D) may be focused on the formation of the upper resistor 136 of the peripheral region P. That is, since the width of the upper resistor 136 can be controlled arbitrarily in the fabrication processes, resistance values of the upper resistor 136 can be varied. In other words, resistance variance of the upper resistor 136 can be increased.

Then, an upper interlayer insulating layer 137 is formed on the semiconductor substrate having the plate electrode 135 and the upper resistor 136. The upper interlayer insulating layer 137 may be formed of a silicon oxide layer. Contact plugs are formed through the upper interlayer insulating layer 137. In specific, a plate contact plug 141 is formed inside the upper interlayer insulating layer 137 of the cell region C to be connected with the plate electrode 135. A lower resistor contact plug 141" and a first contact plug 141a are formed in the upper interlayer insulating layer 137 of the peripheral region P to be connected with one end LE1 and the other end LE2 of the lower resistor 124 respectively, and concurrently, an upper resistor contact plug 141' and a second contact plug 141b are formed to be connected with one end UE1 and the other end UE2 of the upper resistor 136 respectively. Since the contact plugs 141, 141a, 141b, 141', 141" are formed to penetrate one insulating layer, they can be formed to be relatively small in size. In other words, in the case that the resistors and word lines are formed concurrently, contact plugs penetrating a thick multi-layered insulating layer must be formed in order to connect the resistors to metal interconnections. This places a lower limit on the size of the contact plugs. However, according to the present invention, contact plugs penetrating one insulating layer can be formed with a small size.

A metal layer is formed on the upper interlayer insulating layer 137, and the metal layer is patterned, thereby forming metal interconnections. In specific, a plate interconnection 145 is formed on the upper interlayer insulating layer 137 of the cell region C, and concurrently, a first metal interconnection 145a, a second metal interconnection 145b, and a resistor interconnection line 145' are formed on the upper interlayer insulating layer 137 of the peripheral region P. The plate interconnection 145 is formed to contact an upper surface of the plate contact plug 141 penetrating the upper interlayer insulating layer 137, and to be electrically connected with the plate electrode 135. The first metal interconnection 145a is formed to contact an upper surface of the first contact plug 141a penetrating the upper interlayer insulating layer 137, and to be electrically connected with the other end UE2 of the lower resistor 124. The second metal interconnection 145b is formed to contact an upper surface of the second contact plug 141b penetrating the upper interlayer insulating layer 137, and to be electrically connected with the other end UE2 of the upper resistor. The resistor interconnection line 145' is formed to concurrently contact upper surfaces of the upper is resistor contact plug 141' and the lower resistor contact plug 141" penetrating the upper interlayer insulating layer 137 respectively. As a result, one end LE1 of the lower resistor 124 and one end UE1 of the upper resistor 136 are electrically connected.

The upper resistor contact plug 141' and the lower resistor contact plug 141" can optionally be formed into a single resistor contact plug. That is, a contact hole exposing one end UE1 of the upper resistor and one end LE1 of the lower resistor concurrently is formed inside the upper interlayer insulating layer 137, and a resistor contact plug is formed inside the contact hole.

In the case that the lower resistor 124 is formed with a zig-zag line shape in order to realize a high resistance, the upper resistor 136 can be formed to cover a body portion of the lower resistor 124 except for both ends LE1, LE2 of the lower resistor 124 with various shapes, such as those explained above with reference to FIGS. 2B to 2D.

As a result, the upper resistor 136 and the lower resistor 124 are connected in series. The lower resistor 124 can realize a high resistance value without being susceptible to damage during subsequent processes. Even though the upper resistor 136 can be formed to have a lower resistance than that of the lower resistor 124, the process of forming the upper resistor 136 can provide an advantage of resistance variance in the overall resistance value. Thus, when the lower resistor 124 and the upper resistor 136 are connected in series, the resistors can be provided with desired resistance values.

The embodiments of the present invention have described resistors having a high resistance, in which an upper resistor and a lower resistor are connected in series, but the present invention is not limited to these embodiments. That is, a semiconductor device such as DRAM requires resistors having various resistance values. Therefore, instead of connecting the lower resistor and the upper resistor in series like the embodiments of the present invention, the upper and lower resistors can be used as discrete resistors with various shapes, such as a high resistance element and a low resistance element and the like. More particularly, rather than connecting one end of the lower resistor 124 and one end of the upper resistor 136 in series, one end of the lower resistor 124 and the upper resistor 136 can be used as discrete resistance elements. In this case, the resistance interconnection line 145' is separated, and two electrically isolated metal interconnections are provided.

In certain embodiments of the present invention, a single insulating layer is interposed between the upper and lower resistors and the metal interconnections connected to the resistors by the contact plugs. As such, since the contact plugs are formed to penetrate the single insulating layer, they can be formed with a relatively small size. This is advantageous for high integration of semiconductor devices. Further, as described above, since the upper resistor and the lower resistor can be vertically disposed in substantially the same area of the device, this is also advantageous for high integration of semiconductor devices.

According to the embodiments of the present invention as described above, a lower resistor is formed to provide a high resistance, and an upper resistor is formed to cover a body portion of the lower resistor to avoid damage that otherwise would occur during subsequent processes, so that a high resistance of the lower resistor can be substantially realized without large resistance distribution. Further, the upper resistor has an advantage of resistance variance, depending on the configuration chosen for the upper resistor. Therefore, a desired resistance value is provided by connecting the lower resistor and the upper resistor in series. Further, since the upper resistor and the lower resistor can be vertically disposed in a substantially same area, the space occupied by the resistors can be reduced.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device comprising:
    a semiconductor substrate having a cell region and a peripheral region;
    a lower interlayer insulating layer disposed on the semiconductor substrate;
    a buffer pad disposed on the lower interlayer insulating layer in the cell region;
    a capacitor having a storage node electrode disposed on the buffer pad, a plate electrode covering the storage node electrode, and a capacitor dielectric interposed between the storage node electrode and the plate electrode;
    a lower resistor disposed on the lower interlayer insulating layer in the peripheral region;
    an upper resistor disposed on the lower resistor to expose both ends of the lower resistor;
    an inter-resistor insulating layer interposed at least between the lower resistor and the upper resistor;
    an upper interlayer insulating layer disposed on the lower interlayer insulating layer to cover the capacitor, the lower resistor, and the upper resistor; and
    a resistor interconnection line, disposed on the upper interlayer insulating layer, contacting a resistor contact plug penetrating the upper interlayer insulating layer and being electrically connected to a first end of the lower resistor and a first end of the upper resistor.

2. The semiconductor device according to claim 1, wherein the lower resistor and the buffer pad are formed in a same process.

3. The semiconductor device according to claim 2, wherein the lower resistor and the buffer pad are polysilicon layers.

4. The semiconductor device according to claim 1, wherein the upper resistor and the plate electrode are formed in a same process.

5. The semiconductor device according to claim 4, wherein the upper resistor and the plate electrode are formed of at least one layer selected from the group consisting of a polysilicon layer, a stack layer including a titanium nitride layer and a polysilicon layer, a titanium layer, a tantalum layer, a tungsten layer, and a metal nitride layer.

6. The semiconductor device according to claim 5, wherein the metal nitride layer is at least one layer selected from the group consisting of a TiN layer, a TaN layer, a WN layer, a TaSiN layer, a TiSiN layer, a TaAlN layer, and a TiAlN layer.

7. The semiconductor device according to claim 1, wherein the inter-resistor insulating layer and the capacitor dielectric are formed in a same process.

8. The semiconductor device according to claim 7, wherein the capacitor dielectric and the inter-resistor insulating layer are a stacked layer including a silicon oxide layer and a silicon nitride layer, or a high-k dielectric.

9. The semiconductor device according to claim 8, wherein the high-k dielectric is at least one layer selected from the group consisting of a hafnium oxide (HfO) layer, an aluminum oxide (AlO) layer, a zirconium oxide (ZrO) layer, a lanthanum oxide (LaO) layer, a tantalum oxide (TaO) layer, a titanium oxide (TiO) layer, a doped TiO layer, and an STO layer.

10. The semiconductor device according to claim 1, further comprising:
    a first etch stop layer pattern interposed between the capacitor dielectric of the cell region and the lower interlayer insulating layer; and
    a second etch stop layer pattern interposed between the lower resistor of the peripheral region and the inter-resistor insulating layer, and formed in the same process as forming the first etch stop layer pattern.

11. The semiconductor device according to claim 10, wherein the first etch stop layer pattern and the second etch stop layer pattern are silicon nitride layers.

12. The semiconductor device according to claim 1, further comprising:
    a first metal interconnection disposed on the upper interlayer insulating layer so as to contact a first contact plug penetrating the upper interlayer insulating layer and being electrically connected to a second end of the lower resistor; and
    a second metal interconnection disposed on the upper interlayer insulating layer so as to contact a second contact plug penetrating the upper interlayer insulating layer and being electrically connected to a second end of the upper resistor.

13. The semiconductor device according to claim 1, wherein the resistor contact plug comprises a lower resistor contact plug and an upper resistor contact plug penetrating the upper interlayer insulating layer and being electrically connected to the first end of the lower resistor and the first end of the upper resistor respectively.

14. The semiconductor device according to claim 1, wherein the lower resistor has a zig-zag line shape from a planar view orientation.

15. The semiconductor device according to claim 14, wherein the upper resistor has a zig-zag line shape having a greater width than that of the lower resistor from a planar view orientation.

16. The semiconductor device according to claim 1, wherein the upper resistor has a plate shape from a planar view orientation.

17. The semiconductor device according to claim 1, wherein the upper resistor includes multiple parallel resistors from a planar view orientation.

18. A method of fabricating a semiconductor device comprising:
  forming a lower interlayer insulating layer on a semiconductor substrate having a cell region and a peripheral region;
  forming a buffer conductive layer on the lower interlayer insulating layer;
  patterning the buffer conductive layer, thereby forming a buffer pad on the lower interlayer insulating layer in the cell region, and concurrently, forming a lower resistor on the lower interlayer insulating layer in the peripheral region;
  forming a storage node electrode on the buffer pad;
  sequentially forming a dielectric and a conductive layer on the surface of the semiconductor substrate having the storage node electrode;
  patterning the conductive layer and the dielectric, thereby forming a capacitor dielectric and a plate electrode in the cell region, and concurrently, forming an inter-resistor insulating layer and an upper resistor, which are sequentially stacked, to expose both ends of the lower resistor in the peripheral region;
  forming an upper interlayer insulating layer on the surface of the semiconductor substrate having the plate electrode and the upper resistor;
  forming a resistor contact plug in the upper interlayer insulating layer so as to be electrically connected to a first end of the lower resistor and a first end of the upper resistor; and
  forming a resistor interconnection line on the upper interlayer insulating layer to contact the resistor contact plug.

19. The method according to claim 18, further comprising forming an etch stop layer on the surface of the semiconductor substrate having the buffer pad and the lower resistor before forming the storage node electrode, wherein patterning the conductive layer and the dielectric further comprises patterning the etch stop layer.

20. The method according to claim 19, wherein the etch stop layer is formed of a silicon nitride layer.

21. The method according to claim 18, wherein forming a resistor contact plug comprises forming a lower resistor contact plug and an upper resistor contact plug penetrating the upper interlayer insulating layer and being electrically connected to the first end of the lower resistor and the first end of the upper resistor respectively.

22. The method according to claim 18, further comprising forming a first contact plug and a second contact plug penetrating the upper interlayer insulating layer and being electrically connected to a second end of the lower resistor and a second end of the upper resistor respectively, concurrently while forming the resistor contact plug.

23. The method according to claim 22, wherein forming a resistor interconnection line comprises forming a first metal interconnection and a second metal interconnection disposed on the upper interlayer insulating layer and contacting the first contact plug and the second contact plug respectively.

24. The method according to claim 18, wherein the lower resistor is formed to have a zig-zag line shape from a planar view orientation.

25. The method according to claim 24, wherein the upper resistor is formed to have a zig-zag line shape having a greater width than that of the lower resistor from a planar view orientation.

26. The method according to claim 18, wherein the upper resistor is formed to have a plate shape from a planar view orientation.

27. The method according to claim 18, wherein the upper resistor is formed to include multiple parallel resistor structures from a planar view orientation.

28. The method according to claim 18, wherein the buffer conductive layer is formed of a polysilicon layer.

29. The method according to claim 18, wherein the conductive layer is formed of at least one layer selected from the group consisting of a polysilicon layer, a stack layer including a titanium nitride layer and a polysilicon layer, a titanium layer, a tantalum layer, a tungsten layer, and a metal nitride layer.

30. The method according to claim 29, wherein the metal nitride layer is formed of at least one layer selected from the group consisting of a TiN layer, a TaN layer, a WN layer, a TaSiN layer, a TiSiN layer, a TaAlN layer, and a TiAlN layer.

31. The method according to claim 18, wherein the dielectric is formed of a stacked layer including a silicon oxide layer and a silicon nitride layer, or a high-k dielectric.

32. The method according to claim 31, wherein the high-k dielectric is formed of at least one layer selected from the group consisting of a hafnium oxide (HfO) layer, an aluminum oxide (AlO) layer, a zirconium oxide (ZrO) layer, a lanthanum oxide (LaO) layer, a tantalum oxide (TaO) layer, a titanium oxide (TiO) layer, a doped TiO layer, and an STO layer.

* * * * *